United States Patent [19]

Somero et al.

[11] Patent Number: 5,204,277
[45] Date of Patent: Apr. 20, 1993

[54] METHOD OF FORMING BIPOLAR TRANSISTOR HAVING SUBSTRATE TO POLYSILICON EXTRINSIC BASE CONTACT

[75] Inventors: Bradley M. Somero; James D. Hayden, both of Austin, Tex.

[73] Assignee: Motorola, Inc., Schaumburg, Ill.

[21] Appl. No.: 829,669

[22] Filed: Feb. 3, 1992

[51] Int. Cl.$^5$ ............... H01L 21/265; H01L 29/70
[52] U.S. Cl. ............................. 437/31; 437/162; 148/DIG. 10
[58] Field of Search ................ 437/31, 162; 148/DIG. 10, DIG. 11

[56] References Cited

U.S. PATENT DOCUMENTS

| 4,980,305 | 12/1990 | Kadota et al. | 437/31 |
| 5,028,550 | 7/1991 | Hirakawa | 437/31 |

FOREIGN PATENT DOCUMENTS

| 0329401 | 8/1989 | European Pat. Off. | 437/31 |
| 0375323 | 6/1990 | European Pat. Off. | 437/31 |
| 0246874 | 10/1989 | Japan | 437/31 |
| 0246338 | 10/1990 | Japan | 437/31 |
| 2243488 | 10/1991 | United Kingdom | 437/31 |

OTHER PUBLICATIONS

Innovations in Silicon Deposition Technology for Advanced Device Structures, by David L. Haram et al., was partially published in Electron Device Letters, vol. 9, May 1988, pp. 259-261.
Selective Epitaxial Growth of Silicon and Some Potential Applications, by B. J. Ginsberg et al., was published in IBM Journal of Research and Development, vol. 34, No. 6, Nov. 1990, pp. 816-827.
A Novel Self-Aligned Epitaxial Base Transistor, by H. Fujimaki et al., was published and present via IEEE 1991 Bipolar Circuits and Technology Meeting 3.2, pp. 59-62 (date unknown).

*Primary Examiner*—Olik Chaudhuri
*Assistant Examiner*—Long Pham
*Attorney, Agent, or Firm*—Robert L. King

[57] ABSTRACT

A bipolar transistor (10) with reduced substrate trenching and reduced base electrode size. A substrate (12) is provided with an overlying first dielectric layer (20), an overlying first conductive layer (24), an overlying second dielectric layer (26), and a doped collector region (14, 16, and 18). An opening is formed within the layers (20, 24, and 26) forming a sidewall of conductive layer (24). A doped base diffusion (28) is formed within a portion of the substrate (12) exposed by the opening. A conductive grown region (30) is formed laterally adjacent the sidewall of conductive layer (24) and overlies substrate (12). A spacer (32) is formed adjacent a first portion of the conductive grown region (30). A second portion of the conductive grown region (30) is removed forming an exposed portion of substrate (12). A second spacer (36) is formed adjacent spacer (32). A conductive layer (38), which forms a doped emitter region is formed overlying the exposed portion of substrate (12).

14 Claims, 3 Drawing Sheets

METHOD OF FORMING BIPOLAR TRANSISTOR HAVING SUBSTRATE TO POLYSILICON EXTRINSIC BASE CONTACT

FIELD OF THE INVENTION

The present invention relates generally to semiconductor technology, and more particularly, to bipolar transistors.

BACKGROUND OF THE INVENTION

Early in the development of integrated circuits, bipolar junction transistors (BJTs) were manufactured in a diffused BJT configuration that was not self-aligned. A device has no self-aligned structures, layers, or formations when the structures, layers and formations are formed with no precise adjustment or correct relative position to each other. In other words, each structure, layer, and formation of the device is formed independent of the position of the other existing structures, layers, and formations of the device.

In order to form the diffused BJT, a collector electrode is commonly first formed as a diffusion well having a first conductivity type. The collector electrode lies within a substrate and is exposed at a surface of the substrate. A base electrode is formed as a diffusion having a second conductivity type. The base electrode lies within the collector electrode diffusion well and is exposed at the surface of the substrate. In general, the base electrode diffusion is completely surrounded and electrically isolated from the substrate by the collector electrode diffusion well. An emitter electrode is formed as a diffusion well and is contained and electrically isolated within the base electrode diffusion. Electrical contact, via a conducting layer, is made to each of the emitter, base, and collector electrodes thereby completing the diffused BJT structure.

Due to heat cycles and the fact some diffusions in the diffused BJT structure are contained within other diffusions, diffusions in the diffused BJT structure tend to be relatively deep when compared to ideal junction depths. Deep junctions are usually not desired due to leakage currents, speed reduction, parasitic capacitance, and other known deep junction effects. A high series resistance can result in diffused BJTs, which degrades both amplification and switching performance. Diffused BJTs are also difficult to scale and diffusion wells are difficult to position and process consistently with respect to one another. The scaling, positioning, and processing problems result in devices, manufactured by the same process, that vary greatly in performance. In addition, the diffused BJT typically has a current carrying capability that is not as high as desired.

In order to increase amplification gain and improve upon the scaling problem, BJTs are formed with an emitter electrode which is doped via an overlying polysilicon layer. Doping via an overlying polysilicon layer allows diffusion junctions to be relatively shallow. Although this single-polysilicon BJT process results in improved performance over the diffused BJT, the single-polysilicon BJT has several of the diffused BJT disadvantages. Some examples being deep diffusions for the base and collector and a high series resistance.

To improve upon the single-polysilicon BJT, a double-polysilicon BJT is used. The double-polysilicon BJT uses a first layer of polysilicon for forming a base electrode and a second layer of polysilicon for forming an emitter electrode. Performance improves for the double-polysilicon BJT when compared to the single-polysilicon BJT. Due to a presence of exposed silicon regions, etch processing of the double-polysilicon BJT results in substrate trenching problems which leads to etch damage which results in leakage current and may affect series resistance. Also, a physically large base region results which creates larger capacitance and therefore slows the operation of the double-polysilicon BJT.

SUMMARY OF THE INVENTION

The previously mentioned disadvantages are overcome and other advantages achieved with the present invention. The present invention comprises a BJT transistor and a method of forming the same. In one form, a substrate is provided having a surface. A doped collector region having a first conductivity type is formed within the substrate. A first dielectric layer is formed overlying the substrate, a first conductive layer is formed overlying the first dielectric layer, and a second dielectric layer is formed overlying the first conductive layer. A portion of the first and second dielectric layers and a portion of the first conductive layer are removed forming an exposed portion of the substrate and forming a first conductive layer sidewall. A doped base region having a second conductivity type is formed within the exposed portion of the substrate. The doped base region overlies the doped collector region and is exposed at said surface of the substrate. A conductive grown region is formed laterally adjacent the first conductive layer sidewall and overlying the surface of the substrate. A first sidewall spacer is formed laterally adjacent the conductive grown region that is laterally adjacent the first conductive layer. A portion of the conductive grown region which overlies the surface of the substrate is removed forming a conductive grown region sidewall. A second sidewall spacer is formed laterally adjacent the sidewalls of the conductive grown region. A second conductive layer is formed overlying each of the substrate, the first and second sidewall spacer, and the second dielectric layer. The second conductive layer makes physical contact to the doped base region and at least partially forms a doped emitter region.

The present invention will be more clearly understood from the detailed description below in conjunction with the accompanying drawings.

DESCRIPTION OF THE PREFERRED EMBODIMENT

Figure 1:
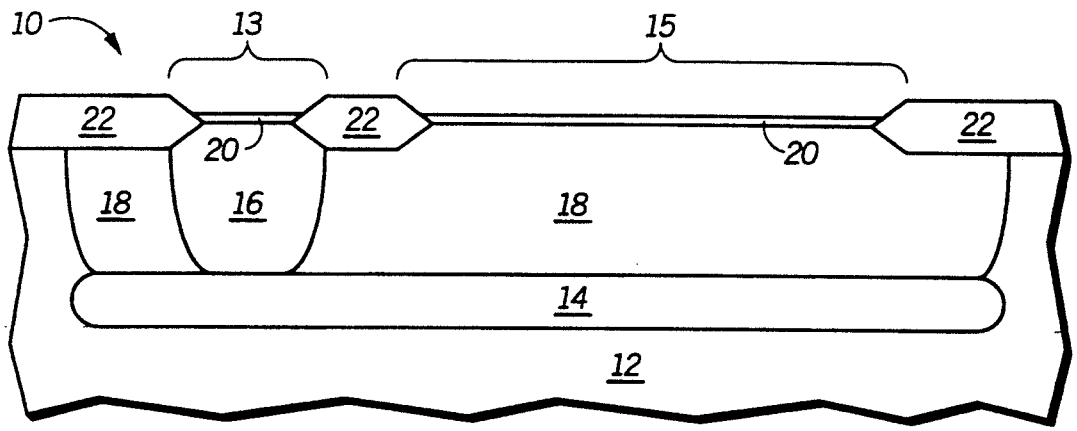
FIGS. 1-9 illustrate, in cross-sectional form, a bipolar transistor and a process for forming the bipolar transistor in accordance with the present invention.

Illustrated in FIGS. 1-9 is a process used to form a bipolar transistor 10. In FIG. 1, transistor 10 has a substrate 12. Substrate 12 may be made of silicon, gallium arsenide, silicon on sapphire, epitaxial formations, germanium, germanium silicon, and/or like substrate materials. Preferably, the substrate 12 is made of silicon. A buried collector region 14, having a first conductivity type, is formed within the substrate 12 which has a second conductivity type. The buried collector region 14 is preferably formed by a high energy implant and anneal process although other processes, such as trench-etch and in-situ doped epitaxial buried region processes, may be used. A doped collector diffusion well or collector well 18 is formed within the substrate overlying the buried collector region 14, and is exposed at a first exposed substrate region 13 and is exposed at a second exposed substrate region 15. The first exposed substrate region 13 and the second exposed substrate region 15 are each a separate portion of a surface of the substrate 12 as illustrated in FIG. 1. The collector well 18 is formed via ion implantation and anneal techniques and/or diffusion processing and preferably has the first conductivity type.

A field dielectric layer 22 or field oxide is formed selectively overlying the substrate 12. The field dielectric layer 22 is patterned via photolithography and etched conventionally or selectively formed via a nitride mask or like mask to form a first exposed surfaces 13 and a second exposed surface 15 of the substrate 12. The field dielectric layer 22 is preferably formed by a silicon dioxide growing ($SiO_2$) process. A wet $SiO_2$ process is preferred over a dry $SiO_2$ process due to the fact that the wet process grows a thick oxide at a faster rate. In general, the first exposed substrate region 13 is used for a collector formation and the second exposed substrate region 15 is used for a base and an emitter formation. A deep collector region 16 is formed within and at a surface of the substrate 12 via the first exposed substrate region 13. Diffusion processing or ion implantation techniques are used to form the deep collector region 16 of a first conductivity type. The deep collector region 16, collector well 18, and the buried collector region 14 together form a doped collector region or collector electrode for transistor 10. The deep collector region 16 is usually adjacent the collector well 18 and electrically connected to the buried collector region 14.

A first dielectric layer or a high quality dielectric layer 20 is formed overlying the first exposed substrate region 13 and the second exposed substrate region 15. The dielectric layer 20 is relatively thin when compared to the field dielectric layer 22 and is formed via a dry $SiO_2$ process. Dry $SiO_2$ processing forms a denser oxide of a superior quality when compared to wet $SiO_2$ processing. Although the field dielectric layer 22 and the dielectric layer 20 are preferably $SiO_2$, other dielectrics such as nitride, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), and/or the like may be used.

Figure 2:
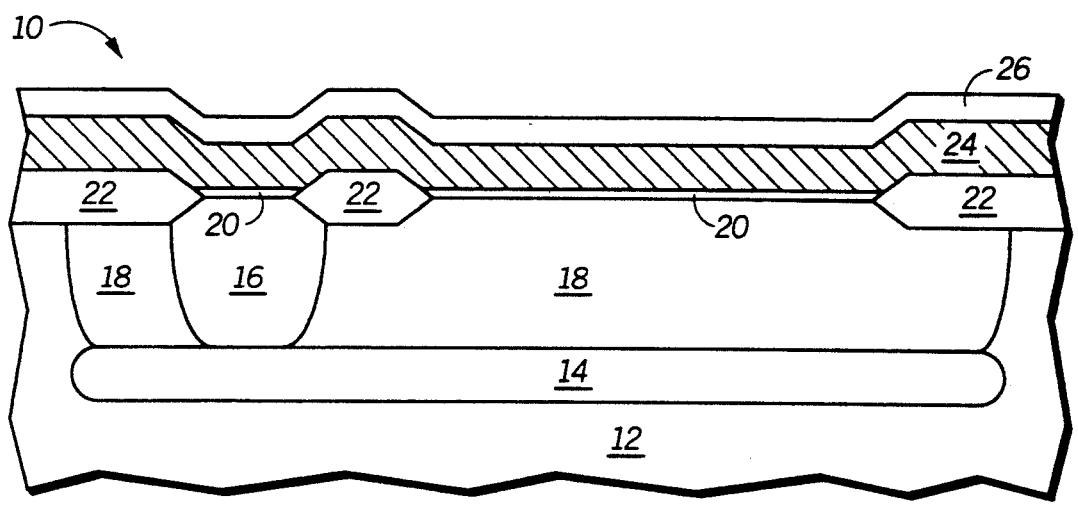

In FIG. 2, a first conductive layer 24 is formed overlying the dielectric layers 20 and 22. Conductive layer 24 is preferably polysilicon or a silicon-based material such as germanium silicon. A second dielectric layer 26 is formed overlying the conductive layer 24. The dielectric layer 26 is preferably a TEOS based dielectric but may be any of the dielectrics discussed herein.

Figure 3:
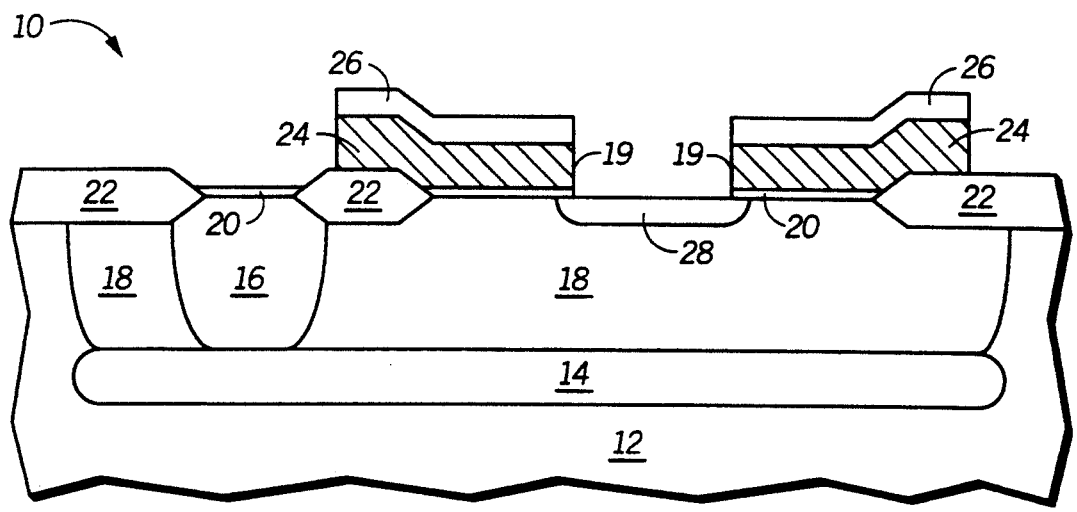

FIG. 3 illustrates the use of an etch step to remove portions of the dielectric layers 20 and 26 and portions of the conductive layer 24 that overlie the second exposed substrate region 15. The removal forms vertical, aligned openings in the dielectric layers 20 and 26 and conductive layer 24. The vertical, aligned openings expose portions of the substrate, referred to as exposed portions of the substrate 12, and form sidewalls 19 of the conductive layer 24. A doped base region or a base diffusion 28 is formed within an exposed portion of the substrate defined by the vertical, aligned opening. The base diffusion 28 is exposed at the surface of the substrate 12, which is also referred to as the first exposed substrate region 15. The base diffusion 28 has dopant atoms of a second conductivity type and therefore is of a second conductivity type. The second conductivity type is opposite the first conductivity type. The base diffusion 28 overlies the buried collector region 14 and lies within the collector well 18. The base diffusion 28 is usually doped with more dopant atoms than the collector well 18.

Figure 4:
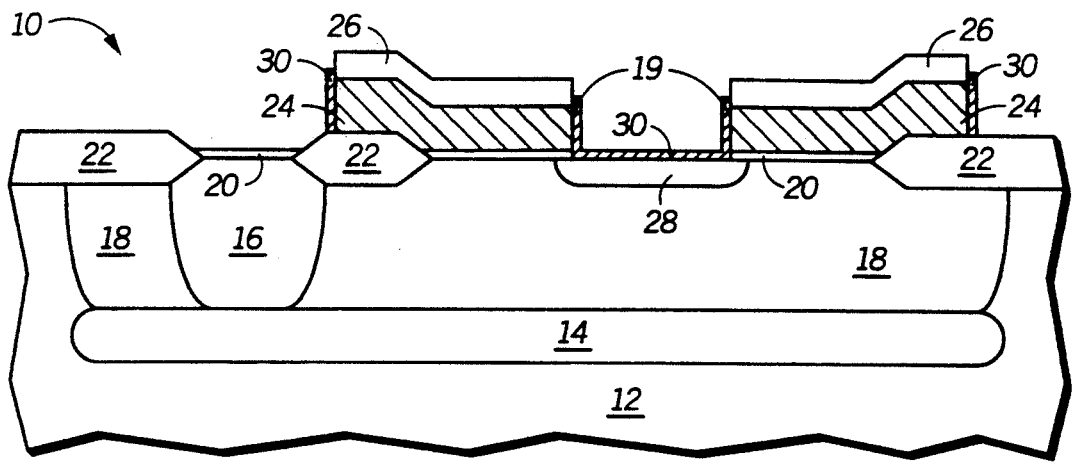

FIG. 4 illustrates the use of an epitaxial growth step or polysilicon deposition to form electrical contact from the conductive layer 24 to the base diffusion 28. In one form, the transistor 10 is placed into a machine suitable for epitaxial growth, such as an epitaxial reactor, a diffusion tube, furnace, or the like. When epitaxial growth is initiated, polysilicon grows on polysilicon and single-crystalline silicon grows on single-crystalline silicon. Therefore, a conductive region or a conductive grown region 30 of epitaxial material is formed overlying the base diffusion 28 and laterally adjacent the sidewalls 19 of the conductive layer 24. In addition, the conductive grown region 30 will encroach along surfaces such as a vertical surface of the dielectric layer 26. Due to the fact that the base diffusion 28 is single-crystalline silicon in a preferred form, a portion of conductive grown region 30 that overlies the base diffusion 28 is single-crystalline silicon. In the same manner, due to the fact the conductive layer 24 is polysilicon in a preferred form, a portion of the conductive grown region 30 that is laterally adjacent the sidewalls 19 of conductive layer 24 is polysilicon.

In another form, the region 30 can be formed by a polysilicon deposition step. The deposition step along with subsequent etch steps results in a formation that is similar to the previously mentioned epitaxial region 30. The only difference is that the region 30 is now polysilicon in origin and not grown epitaxial material as described above.

Figure 5:
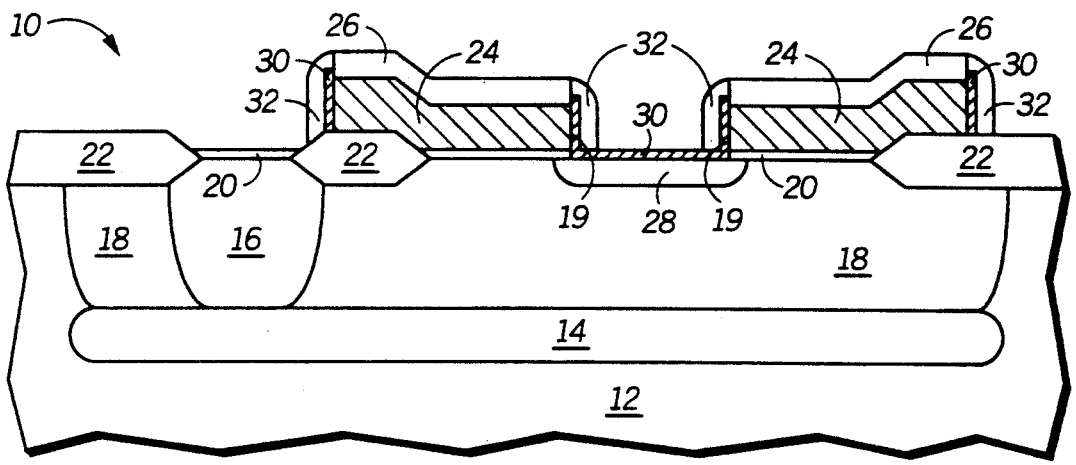

In FIG. 5, a first sidewall spacer 32 is formed laterally adjacent the portion of the conductive grown region 30 that is laterally adjacent the sidewalls 19 of conductive layer 24. The spacer 32 is formed via known dielectric spacer technology and can be made of any dielectric material described herein. Preferably, the spacer 32 is made of a low temperature oxide (LTO), such as a TEOS based oxide, or a nitride material.

Figure 6:
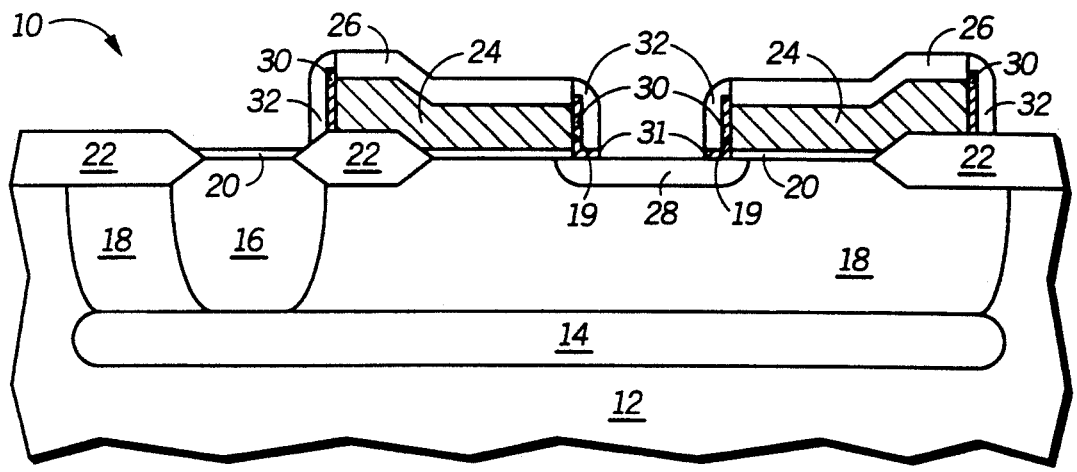

In FIG. 6, a portion of the conductive grown region 30 which overlies the base diffusion 28 and lies within a perimeter of the spacer 32 is removed. Due to the fact that the base diffusion 28 lies within the substrate 12 and is exposed at the surface of the substrate 12, the portion of the conductive grown region 30 which is removed is also referred to as overlying the surface of the substrate 12. The removal of the portion of the conductive grown region 30 forms a sidewall 31 of conductive grown region 30 as illustrated in FIG. 6. The sidewall 31 of conductive grown region 30 and a portion of the remaining conductive grown region 30 overlies a predetermined peripheral portion of the second exposed portion of the substrate 12. The removal of the portion of the conductive grown region 30 is not selective to the substrate 12. Although the etch is not selective, significant trenching of the substrate 12 will not occur due to the fact that the conductive grown region 30 is very thin.

When etching a thick film, process variation requires that the thick film be over-etched. Over-etching is a technique wherein an etch step continues for a prolonged period of time to ensure that the etching of a material is complete regardless of machine variation, film thickness variation, chemistry related variation, and so on. An over-etch step is either not necessary or occurs only for a brief period of time when etching thin films. Therefore, damage to underlying layers is minimized when a thin film is etched. Due to the fact that substrate 12 trenching is avoided or is insignificant in transistor 10, transistor 10 has superior performance when compared to known BJT transistor structures. Typically, series resistance is reduced and base leakage is improved by avoiding the substrate 12 trenching. In addition, the etching removes corner defects of the epitaxial growths away from a base-emitter electrical junction region and decreases a physical size of the doped base region 28. By removing the corner defects, leakage current, altered diffusion characteristics, and other known defect-related complications are reduced or avoided in transistor 10.

Figure 7:
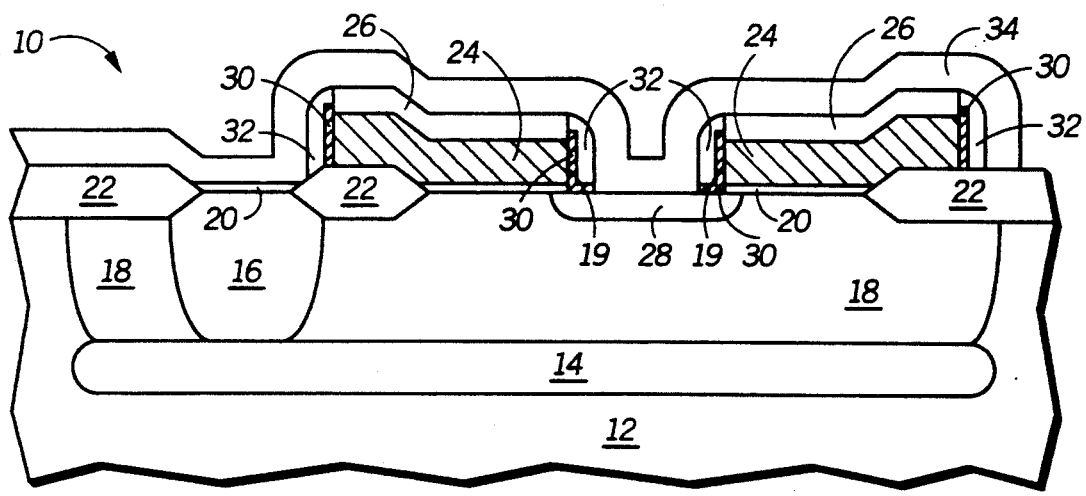

FIG. 7 illustrates the formation of a conformal dielectric layer 34. In a preferred form, the dielectric layer 34 is a TEOS based dielectric although other dielectrics are sometimes used. Dielectric layer 34 is formed overlying at least portions of the dielectric layers 22 and 26, and the spacer 32.

Figure 8:
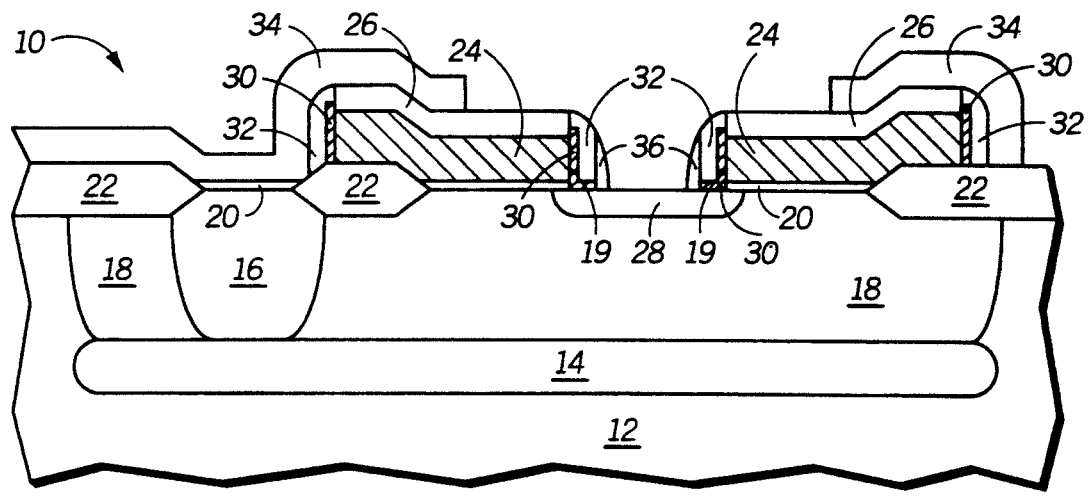

FIG. 8 illustrates the formation of a second dielectric spacer 36. Spacer 36 is formed laterally adjacent the sidewall 31 of conductive grown region 30 and overlies the base diffusion 28. Spacer 36 is formed by anisotropically etching a portion of the dielectric layer 34. Therefore, the spacer 36 is preferably a TEOS based dielectric.

Figure 9:
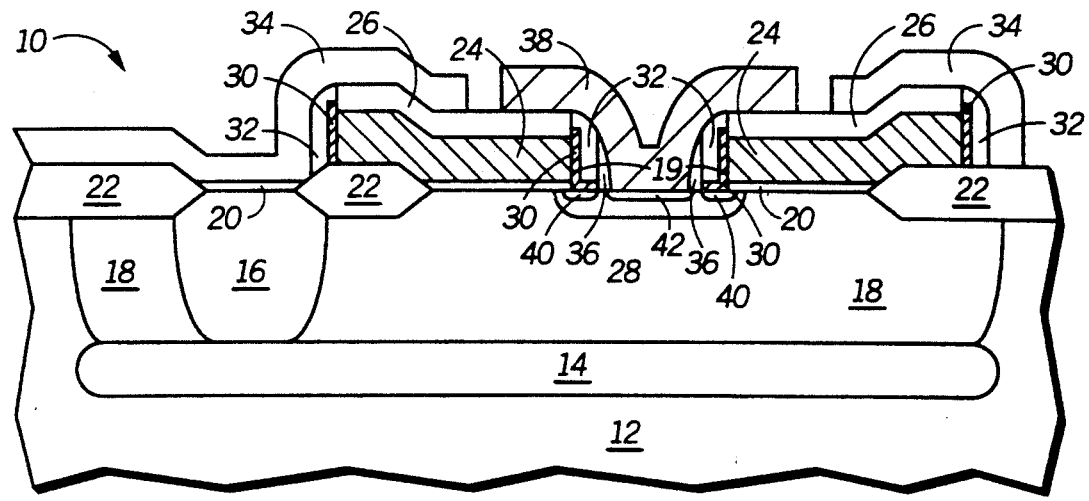

In FIG. 9, a conductive layer 38 is formed overlying the spacers 36 and 32 and overlying a portion of the dielectric layer 26. In a preferred form, the conductive layer 38 is made of polysilicon and makes contact to the surface of the substrate. A heat cycle or subsequent heat cycles are used to drive dopant atoms from the conductive layers 24 and 38 into the base diffusion 28 or equivalently the substrate 12. Heating the conductive layer 24 drives dopant atoms of the second conductivity type into the substrate 12 forming heavily doped diffusions 40, which is also referred to as an extrinsic base. Heating the conductive layer 38 drives dopant atoms of the first conductivity type into the substrate 12 forming the emitter diffusion 42. The conductive layer 24, base diffusion 28 and the heavily doped diffusions 40 are all of the second conductivity type and therefore form a doped base region or a base electrode for the transistor 10. Conductive layer 38 and emitter diffusion 42 are of the first conductivity type and therefore form a doped emitter region or an emitter electrode for transistor 10.

Spacer 36 electrically isolates the conductive grown region 30 from the conductive layer 38. This isolation prevents the formation of a polysilicon emitter-base P-N junction, which is a substandard P-N junction when compared to a single-crystalline silicon P-N junction. Therefore, transistor 10 performance is improved due to the fact that only a single-crystalline emitter-base P-N junction contained within the substrate 12 is formed. This single-crystalline emitter-base P-N junction is formed via a diffusion of dopant atoms from conductive layer 38 into the substrate 12.

It is known that an NPN BJT has better performance than a PNP BJT due to variation in conductivity and diffusion coefficients from a P-type silicon material to an N-type silicon material. Therefore, in many cases the first conductivity type is N type and the second conductivity type is P type. It should be noted that the inventive process disclosed herein is capable of forming a transistor 10 that is either NPN or PNP doped.

Transistor 10 is formed wherein junctions are shallower than many conventional BJTs, substrate trenching and many adverse effects associated with substrate trenching are reduced, corner defects are removed from the base-emitter P-N junction to reduce leakage and other unwanted phenomena. Furthermore, low temperature processing is possible and results in a narrow base electrode. A narrow base electrode improves switching speeds of bipolar transistors. In addition, the total base area is reduced, and therefore a collector-base capacitance is reduced, by self-aligning the heavily doped diffusions 40 to the substrate 12.

While the present invention has been illustrated and described with reference to specific embodiments, further modifications and improvements will occur to those skilled in the art. For example, it is possible to build NPN and/or PNP transistor junctions with many doping methods such as implantation, knock-in processing, diffusion technology, or the like. Spacers can be replaced by sidewall oxidations or other techniques and still perform the same basic functions. Many dielectric and conductive materials exist that are compatible with transistor 10 and the process disclosed herein. Many physical and geometric structures exist for collector, base, and emitter formation. For example, a buried layer for a collector may not necessarily be used or a deep collector region connection may not necessarily be used. Subsequent processing, such as forming overlying metal layers, forming inter-level dielectric layers, depositing passivation layers and the like, can be added to the inventive process. It is to be understood, therefore, that this invention is not limited to the particular forms illustrated and that it is intended in the appended claims to cover all modifications that do not depart from the spirit and scope of this invention.

We claim:

1. A process for forming a bipolar transistor comprising the steps of:
   providing a substrate having a surface;
   forming a doped collector region having a first conductivity type, the doped collector region being formed within the substrate;
   forming a first dielectric layer overlying the substrate;
   forming a first conductive layer overlying the first dielectric layer;
   forming a second dielectric layer overlying the first conductive layer;
   removing a portion of the first and second dielectric layers and a portion of the first conductive layer, the removing forming an exposed portion of the substrate which contains the doped collector region and forming a first conductive layer sidewall;
   forming a doped base region having a second conductivity type within the exposed portion of the substrate and overlying the doped collector region, the doped base region being exposed at said surface of the substrate;
   forming a conductive region laterally adjacent the first conductive layer sidewall and overlying the surface of the substrate;
   forming a first sidewall spacer laterally adjacent the conductive region that is laterally adjacent the first conductive layer;
   removing a portion of the conductive region which overlies the surface of the substrate, the removing of the portion of the conductive region forming a sidewall of the conductive region;

forming a second sidewall spacer laterally adjacent the sidewall of the conductive region; and forming a second conductive layer having the first conductivity type and overlying each of the substrate, the first and second sidewall spacers, and the second dielectric layer, the second conductive layer making physical contact to the substrate and at least partially forming a doped emitter region.

2. The process of claim 1 wherein the first conductivity type is N type and the second conductivity type is P type.

3. The process of claim 1 wherein the first conductivity type is P type and the second conductivity type is N type.

4. The process of claim 1 wherein the step of removing a portion of the conductive region further comprises removing all of the portion of the conductive region and removing a portion of the underlying substrate.

5. The process of claim 1 wherein the step of removing a portion of the conductive region further comprises leaving a portion of the conductive region overlying the substrate.

6. The process of claim 1 wherein the step of forming the doped collector region further comprises:

forming a doped collector well of the first conductivity type within the substrate, the doped collector well surrounding the doped base region and being exposed at the surface of the substrate;

forming a buried collector region of the first conductivity type underlying the doped collector well; and forming a deep collector diffusion well adjacent the doped collector well and exposed at a surface of the substrate, the deep collector diffusion making electrical contact to the buried collector region.

7. The process of claim 1 further comprising the step of driving dopant atoms out of the first conductive layer to form heavily doped diffusions having the second conductivity type and lying within the doped base region.

8. The process of claim 1 further comprising the step of driving dopant atoms out of the second conductive layer to form a heavily doped diffusion having the first conductivity type and lying within the doped base region.

9. The process of claim 1 wherein the conductive region is made of either epitaxially grown material or polysilicon.

10. A process for forming a bipolar transistor, comprising the steps of:

providing a silicon substrate having a surface;

implanting and diffusing a doped collector region having a first conductivity type, the doped collector region being formed within the silicon substrate and being exposed at the surface of the silicon substrate;

growing a silicon dioxide layer overlying the substrate;

depositing a first polysilicon layer overlying the first silicon dioxide layer;

depositing a TEOS based layer overlying the first polysilicon layer;

etching a portion of the silicon dioxide layer, a portion of the TEOS based layer, and a portion of the first polysilicon layer, the etching forming an exposed portion of the substrate which contains the doped collector region and forming a first polysilicon layer sidewall;

implanting and diffusing a doped base region having a second conductivity type within the exposed portion of the substrate and overlying the doped collector region, the doped base region exposed at said surface of the substrate;

growing a conductive epitaxially grown region laterally adjacent the first polysilicon layer sidewall and overlying the surface of the substrate;

forming a first dielectric sidewall spacer laterally adjacent the conductive epitaxially grown region that is adjacent the first polysilicon layer;

etching a portion of the conductive epitaxially grown region which overlies the surface of the substrate, the etching of the portion of the conductive epitaxially grown region forming a sidewall of the conductive epitaxially grown region;

forming a second dielectric sidewall spacer laterally adjacent the sidewall of the conductive epitaxially grown region; and depositing a second polysilicon layer having the first conductivity type and overlying each of the substrate, the first and second dielectric sidewall spacers, and the TEOS based layer, the second polysilicon layer being electrically coupled to the substrate and at least partially forming a doped emitter region.

11. The process of claim 10 wherein the step of etching a portion of the conductive grown region further comprises leaving a portion of the conductive grown region overlying the substrate.

12. The process of claim 10 wherein the step of implanting and diffusing the doped collector region further comprises:

forming a doped collector well of the first conductivity type within the substrate, the doped collector well surrounding the doped base region and being exposed at the surface of the substrate;

forming a buried collector region of the first conductivity type underlying the doped collector well; and forming a deep collector diffusion well adjacent the doped collector well and exposed at a surface of the substrate, the deep collector diffusion making electrical contact to the buried collector region.

13. The process of claim 10 further comprising the step of driving dopant atoms out of the first conductive layer to form heavily doped diffusions having the second conductivity type within the doped base region, the heavily doped diffusions being part of a base electrode.

14. The process of claim 10 further comprising the step of driving dopant atoms out of the second conductive layer to form an emitter diffusion having the first conductivity type within the doped base region, the emitter diffusion forming a portion of the doped emitter region.

* * * * *